(12) United States Patent
Cheng et al.

(10) Patent No.: US 11,622,452 B2
(45) Date of Patent: Apr. 4, 2023

(54) METHOD OF MANUFACTURING A CONDUCTIVE TRACK ON A BOARD VIA STENCIL PRINTING

(71) Applicant: Robert Bosch GmbH, Stuttgart (DE)

(72) Inventors: Bo Cheng, Malden, MA (US); Charles Tuffile, Swansea, MA (US)

(73) Assignee: ROBERT BOSCH GMBH

( * ) Notice: Subject to any disclaimer, the term of this patent is extended or adjusted under 35 U.S.C. 154(b) by 0 days.

(21) Appl. No.: 17/410,312

(22) Filed: Aug. 24, 2021

(65) Prior Publication Data

US 2023/0062635 A1 Mar. 2, 2023

(51) Int. Cl.
*H05K 3/12* (2006.01)
*H05K 3/40* (2006.01)

(52) U.S. Cl.
CPC ......... *H05K 3/1233* (2013.01); *H05K 3/1225* (2013.01); *H05K 3/4053* (2013.01); *H05K 2203/0139* (2013.01)

(58) Field of Classification Search
CPC .. H05K 3/1225; H05K 3/1233; H05K 3/4053; H05K 2203/0139
See application file for complete search history.

(56) References Cited

U.S. PATENT DOCUMENTS

| | | |
|---|---|---|
| 4,323,593 A | 4/1982 | Tsunashima |
| 4,739,919 A | 4/1988 | Van Den Brekel et al. |
| 4,872,261 A | 10/1989 | Sanyal et al. |
| 5,400,948 A | 3/1995 | Sajja et al. |
| 5,448,948 A | 9/1995 | Somers et al. |
| 5,669,970 A | 9/1997 | Balog et al. |
| 5,681,387 A | 10/1997 | Schmidt |
| 5,819,652 A | 10/1998 | Utter et al. |
| 5,878,661 A | 3/1999 | Glovatsky et al. |
| 6,089,151 A | 7/2000 | Cobbley et al. |
| 6,113,216 A | 9/2000 | Wong |
| 6,142,357 A | 11/2000 | Howell |
| 6,316,289 B1 | 11/2001 | Chung |
| 6,889,886 B2 | 5/2005 | Hazeyama et al. |
| 6,988,652 B2 * | 1/2006 | Fleck ............ H05K 3/1225 118/721 |
| 7,383,770 B2 | 6/2008 | Kambara |
| 7,931,187 B2 | 4/2011 | Gruber et al. |

(Continued)

FOREIGN PATENT DOCUMENTS

| | | | |
|---|---|---|---|
| EP | 2219426 A1 | 8/2010 | |
| EP | 3629683 A1 * | 4/2020 | ............ B41N 1/248 |

(Continued)

*Primary Examiner* — Christopher E Mahoney
*Assistant Examiner* — Marissa Ferguson-Samreth
(74) *Attorney, Agent, or Firm* — Dickinson Wright PLLC

(57) ABSTRACT

A method for printing conductive solder paste on a base substrate to establish an electrical connection is provided. The method includes applying conductive solder paste over a stencil, and within an opening of the stencil to contact the base substrate therebeneath. In embodiments, a squeegee can be used to scrape some of the conductive solder paste off of the stencil, leaving behind some of the conductive solder paste within the opening. Subsequently, the stencil can be removed at a speed of more than 200 millimeters per second to help reduce the end-of-track bump ultimately formed at the end of the conductive solder paste that remains after the stencil is removed.

9 Claims, 16 Drawing Sheets

(56) References Cited

U.S. PATENT DOCUMENTS

| | | |
|---|---|---|
| 8,052,035 B2 | 11/2011 | Cheng et al. |
| 2003/0042287 A1 | 3/2003 | Inoue |
| 2003/0061948 A1 | 4/2003 | Coleman et al. |
| 2003/0164395 A1 | 9/2003 | Tong et al. |
| 2004/0112944 A1 | 6/2004 | Tong et al. |
| 2004/0188502 A1 | 9/2004 | Mori et al. |
| 2005/0077025 A1 | 4/2005 | Bezama et al. |
| 2005/0208709 A1 | 9/2005 | Imai et al. |
| 2007/0199456 A1 | 8/2007 | Kang et al. |
| 2009/0173245 A1 | 7/2009 | Irisawa et al. |
| 2009/0239091 A1 | 9/2009 | Abe |
| 2010/0176084 A1 | 7/2010 | Kang et al. |
| 2011/0192301 A1 | 8/2011 | Abe et al. |
| 2011/0259222 A1 | 10/2011 | Tanaka et al. |
| 2011/0297020 A1 | 12/2011 | Tanaka |
| 2011/0303108 A1* | 12/2011 | Tanaka .................. H05K 3/1233 101/123 |
| 2011/0315028 A1 | 12/2011 | Abe et al. |
| 2012/0000380 A1 | 1/2012 | Tanaka et al. |
| 2013/0032048 A1 | 2/2013 | Falcon |
| 2020/0361013 A1 | 11/2020 | Aoki et al. |
| 2021/0329793 A1 | 10/2021 | Del Rey et al. |

FOREIGN PATENT DOCUMENTS

| | | | | |
|---|---|---|---|---|
| JP | H09266372 A | | 10/1997 | |
| JP | 2003257891 A | * | 9/2003 | ............. H01L 24/02 |
| JP | 2003257891 A | | 9/2003 | |
| JP | 2003266629 A | * | 9/2003 | |
| JP | 2003266629 A | | 9/2003 | |
| KR | 100685080 B | | 2/2007 | |
| KR | 101845800 B | | 3/2013 | |

\* cited by examiner

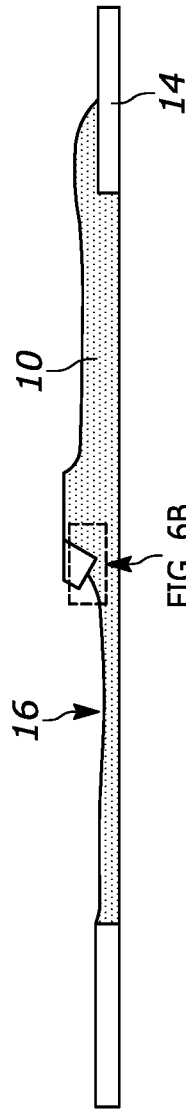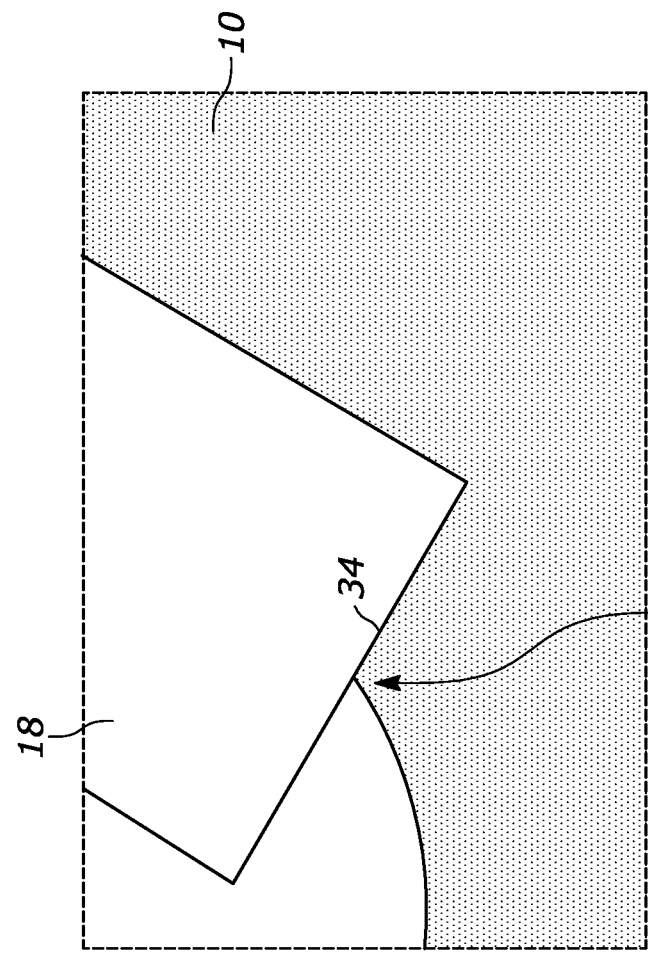

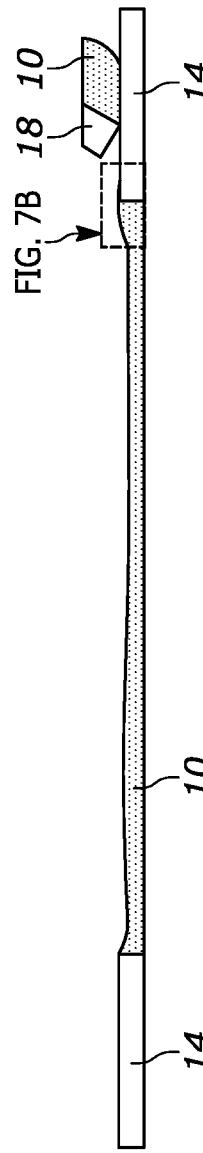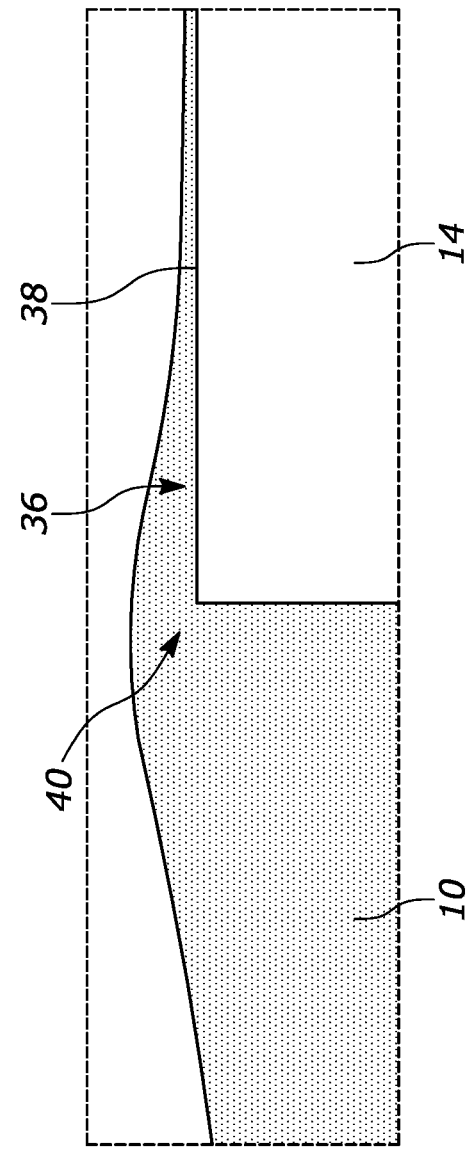

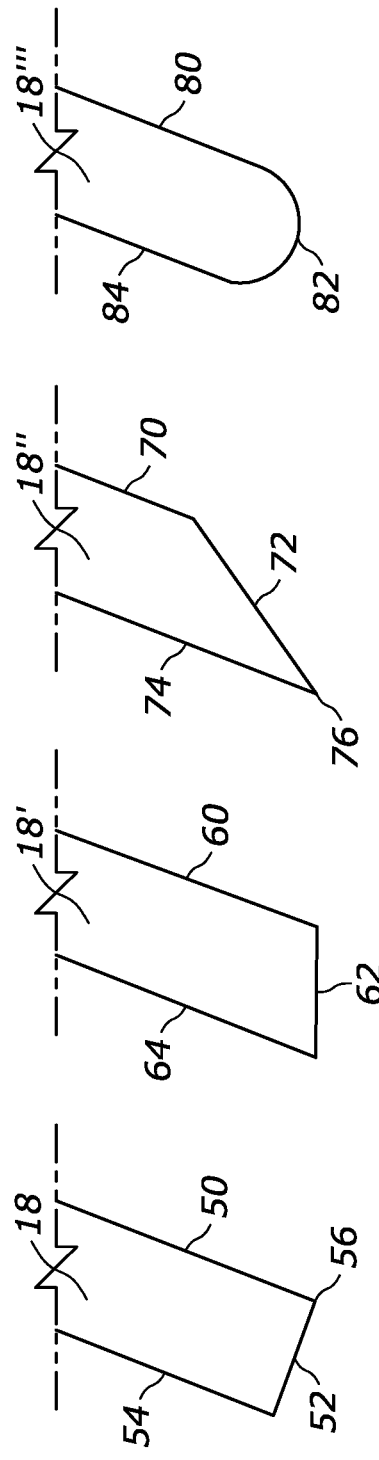

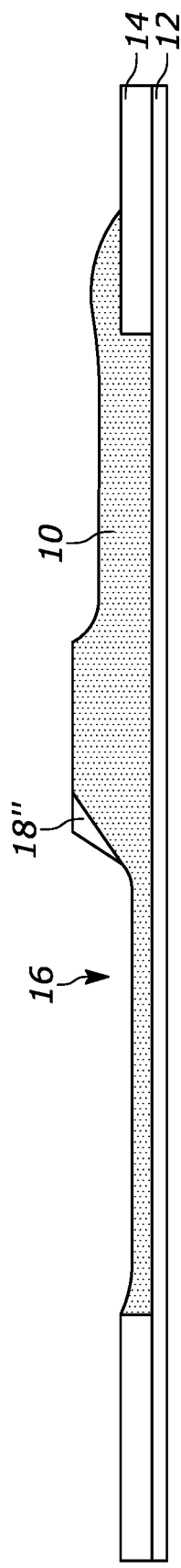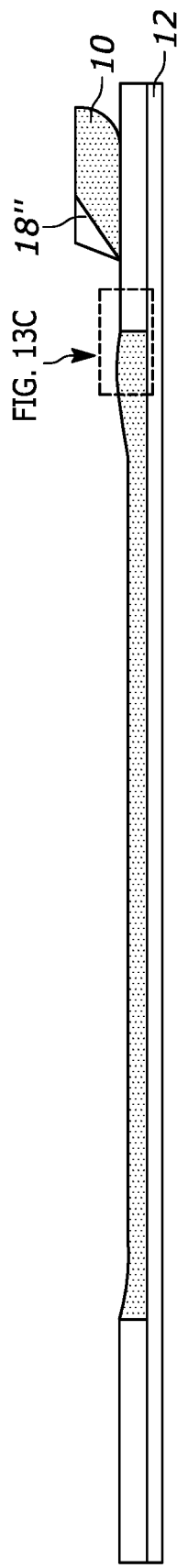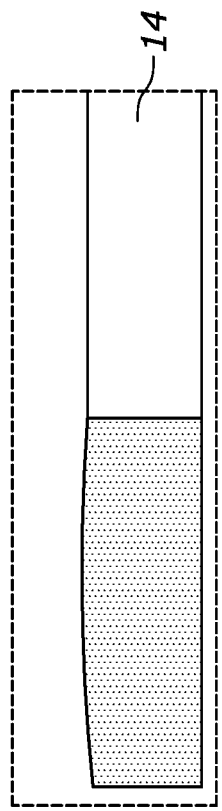
FIG. 13A
FIG. 13B
FIG. 13C

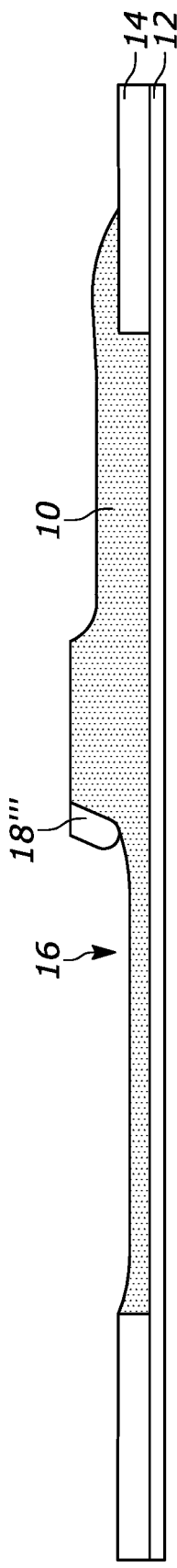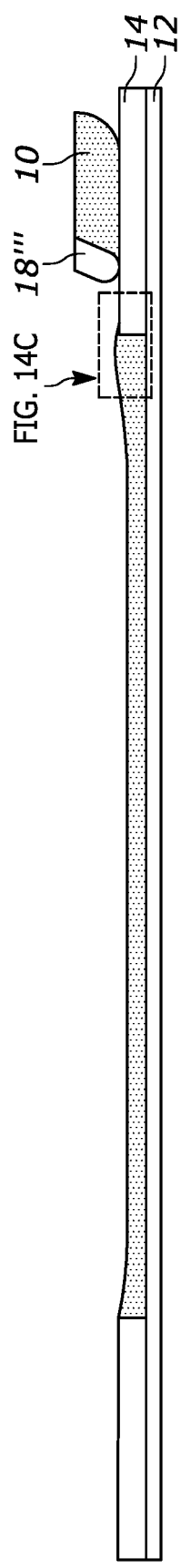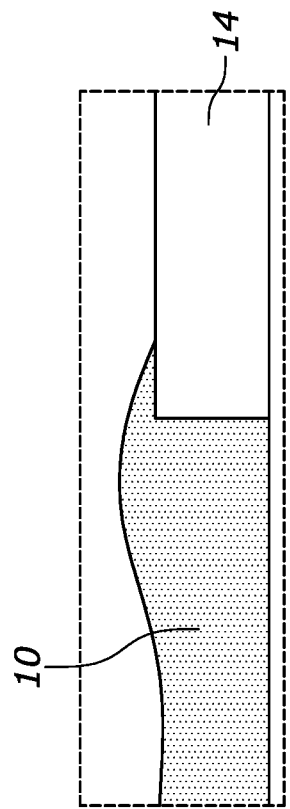
FIG. 14A
FIG. 14B
FIG. 14C

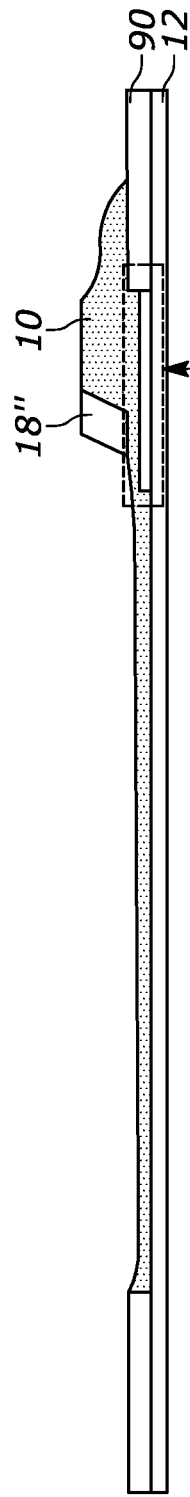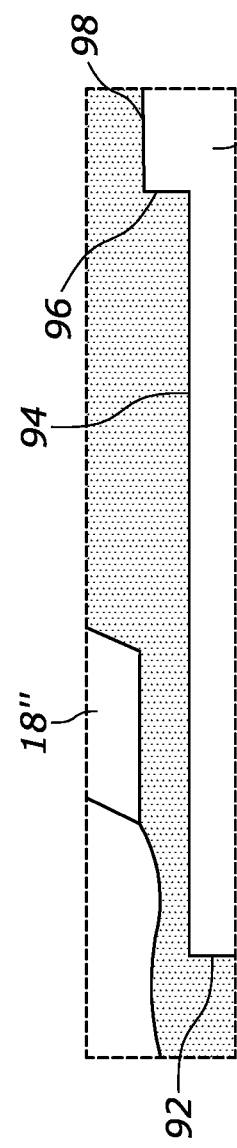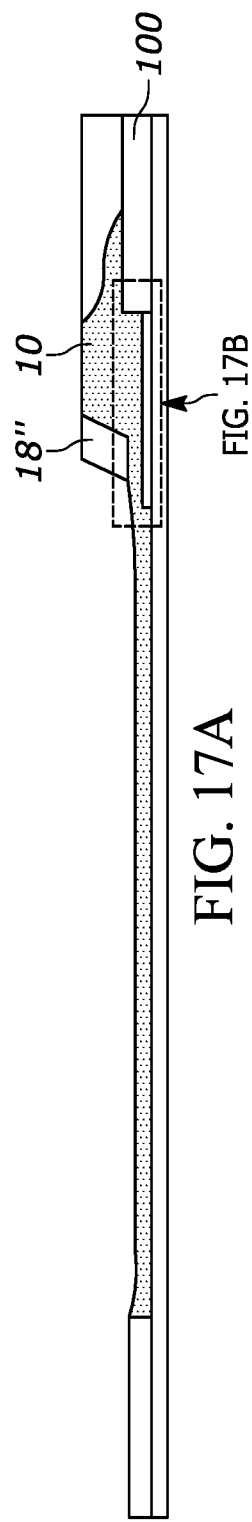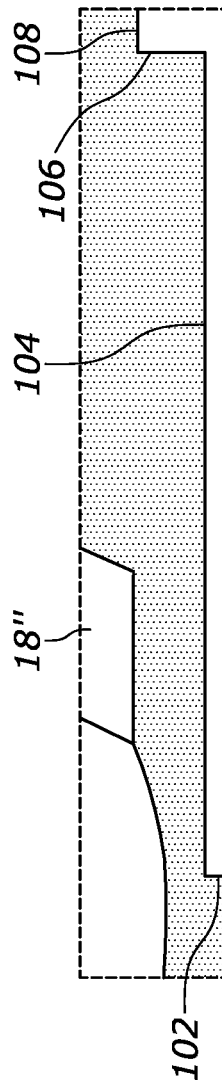

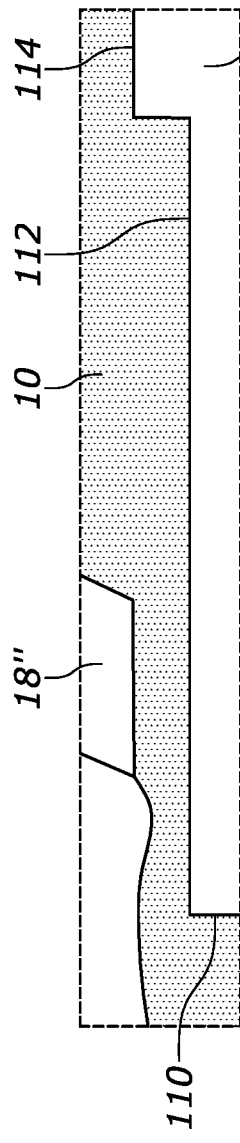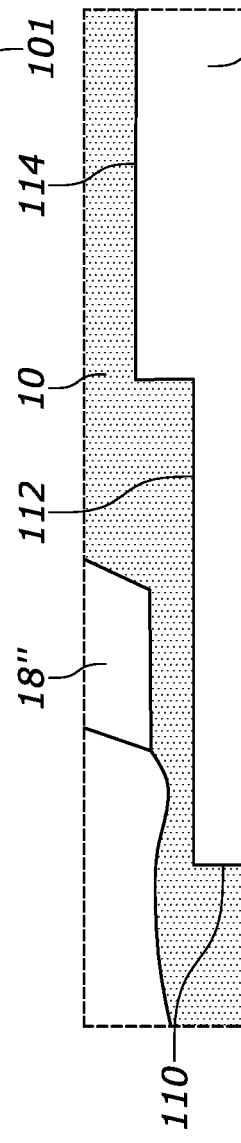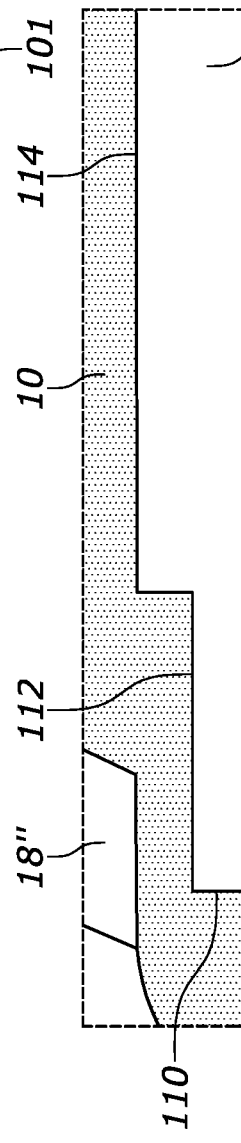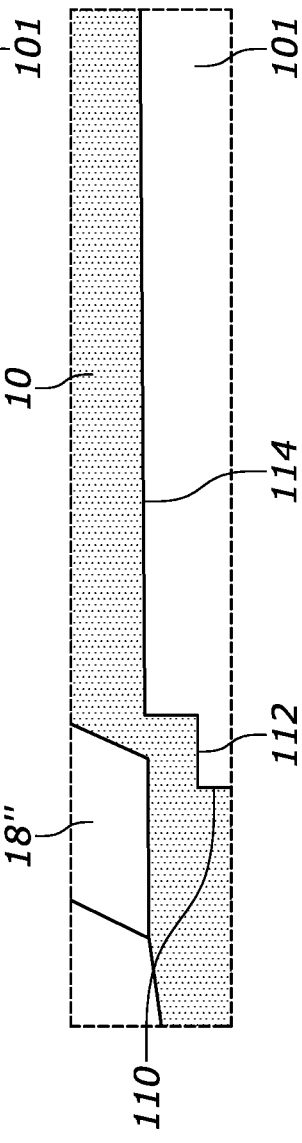

METHOD OF MANUFACTURING A CONDUCTIVE TRACK ON A BOARD VIA STENCIL PRINTING

CROSS-REFERENCE TO RELATED APPLICATIONS

The present application is related to co-pending application Ser. No. 17/410,273, titled FLATTENING SURFACE OF PASTED TRACK IN STENCIL PRINTING PROCESS, filed on the same day as the present application. The present application is also related to co-pending application Ser. No. 17/410,343, titled SQUEEGEE FOR STENCIL PRINTING, filed on the same day as the present application. The present application is also related to application Ser. No. 17/410,381, titled STENCIL FOR STENCIL PRINTING PROCESS, filed on the same day as the present application. Those applications are incorporated herein by reference in their entirety, but they are not admitted to be prior art with respect to the present application by mention in this cross-reference section.

TECHNICAL FIELD

The present disclosure relates to methods of manufacturing a conductive track on a board via stencil printing.

BACKGROUND

For printed circuit board (PCB) applications, and others, tracks of conductive paste can be printed on the board using stencils. Stencil printing is the process of depositing paste (e.g., solder paste) on an underlying board to establish electrical connections. For example, a stencil can be layered on top of the board, and paste can be provided into the holes of the stencil and thereby onto the board using a squeegee. The stencil can then be removed from the underlying board, leaving behind the paste in a desired shape as dictated by the pattern on the stencil. The paste can then be cured, creating a hardened conductive track configured to electrically connect multiple components on the board.

SUMMARY

According to an embodiment, a method of manufacturing a conductive track on a board via stencil printing is provided. The method includes using a squeegee, spreading a conductive paste across an upper surface of a stencil placed on top of an underlying base, wherein the spreading forces the conductive paste into an opening of the stencil and onto the underlying base; and removing the stencil from the underlying base at a speed of at least 200 millimeters per second.

According to an embodiment, a method of manufacturing a conductive track on a board via stencil printing includes placing a stencil over an underlying base, wherein the stencil has an opening extending therethrough; applying a conductive paste within the opening such that a first portion of the conductive paste contacts the underlying base; scraping a second portion of the conductive paste off of the stencil using a squeegee with the first portion of the conductive paste remaining in the opening; and removing the stencil from the underlying base in a vertical direction at a speed of at least 200 millimeters per second, leaving behind the first portion of the conductive paste.

According to an embodiment, a method of manufacturing a conductive track on a board via stencil printing includes placing a stencil over an underlying base; applying a conductive paste within the opening, wherein some of the conductive paste in the opening contacts the underlying base and some of the paste within the opening contacts a floor of the stencil; and removing the stencil from the underlying base at a speed of at least 200 millimeters per second to carry some of the conductive paste on the floor away from the underlying base and leaving behind some of the conductive paste that contacts the underlying base.

BRIEF DESCRIPTION OF THE DRAWINGS

FIG. 6A shows a side view of a squeegee moving across an opening in a stencil, and FIG. 6B shows an enlarged view of a region of FIG. 6A highlighting the paste material being dragged along behind the squeegee due to surface tension, according to an embodiment.

FIG. 7A shows a side view of the squeegee moving further across the opening of FIG. 6A, and FIG. 7B shows an enlarged view of a region of FIG. 7A highlighting residual paste left on the stencil, according to an embodiment.

FIGS. 11A-11D illustrated various shapes of the bottom surface of the squeegee according to embodiments.

FIGS. 13A-13C show similar views as FIGS. 12A-12C, except now using the squeegee of FIG. 11C according to an embodiment.

FIGS. 14A-14C show similar views as FIGS. 12A-12C, except now using the squeegee of FIG. 11D according to an embodiment.

FIG. 16A shows a stencil having a stepped edge according to an embodiment; FIG. 16B shows an enlarged region of FIG. 16A.

FIG. 17A shows a stencil having a stepped edge according to another embodiment;

FIG. 17B shows an enlarged region of FIG. 17A.

FIGS. 19A-19D show stencils having stepped edges according to various embodiments.

DETAILED DESCRIPTION

Figure 1A:
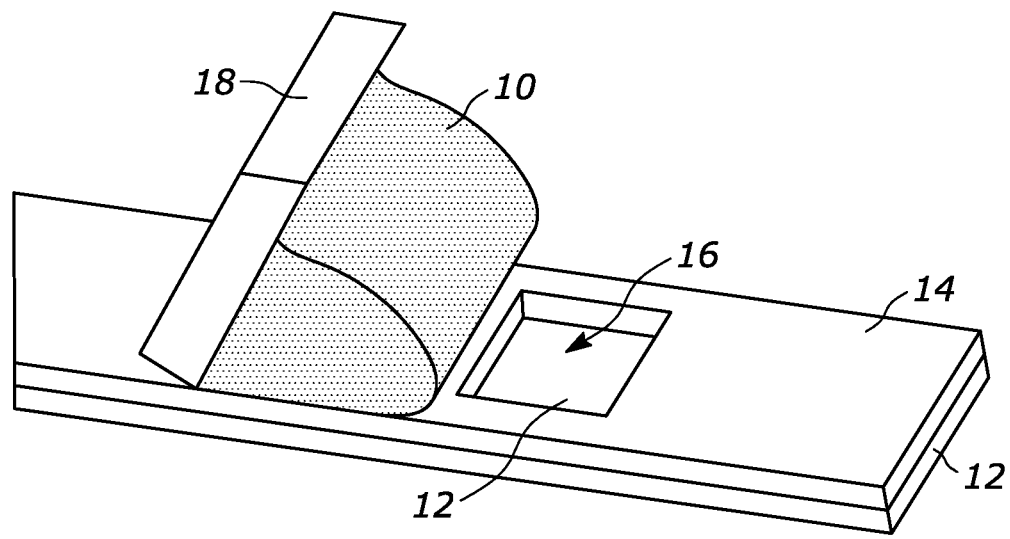
FIG. 1A shows an embodiment of a top perspective view of a paste being spread toward an opening in a stencil and onto a base substrate.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Conductive pastes can be applied to an underlying base substrate by using a stencil. The stencil may be placed over the underlying base substrate, and the conductive paste can be spread over the stencil where it comes into contact with the underlying base substrate via holes in the stencil. This process can be utilized for printed circuit board (PCB) applications, and others including fuel cells, electrode assemblies, and the like. Once cured, the conductive paste hardens to form a conductive track between two electrical components on the base substrate (e.g., the PCB board).

FIGS. 1-5 show a process of applying a paste to a PCB board utilizing a stencil, according to an embodiment. FIGS. 1A and 1B show an initial application of a conductive paste 10 to apply a pasted track to an underlying base substrate, or base 12. The paste 10 can be a glue or adhesive containing silver or other conductive material that will ultimately, once cured, form a conductive path between components on the underlying base 12. The base 12 may be a PCB board, a ceramic, polymer, glass, or a conductive material. A stencil 14 is placed over the base 12. The stencil 14 has an aperture or opening 16 through which the paste 10 can come into contact with the base 12. The stencil may have many openings and of differences sizes and shapes to create a desired pattern of electrical conduits printed on the base 12. A squeegee 18 is used to move horizontally to spread and scrape the paste 10 across an upper surface of the stencil to fill the opening 16 with the paste 10.

Figure 1B:
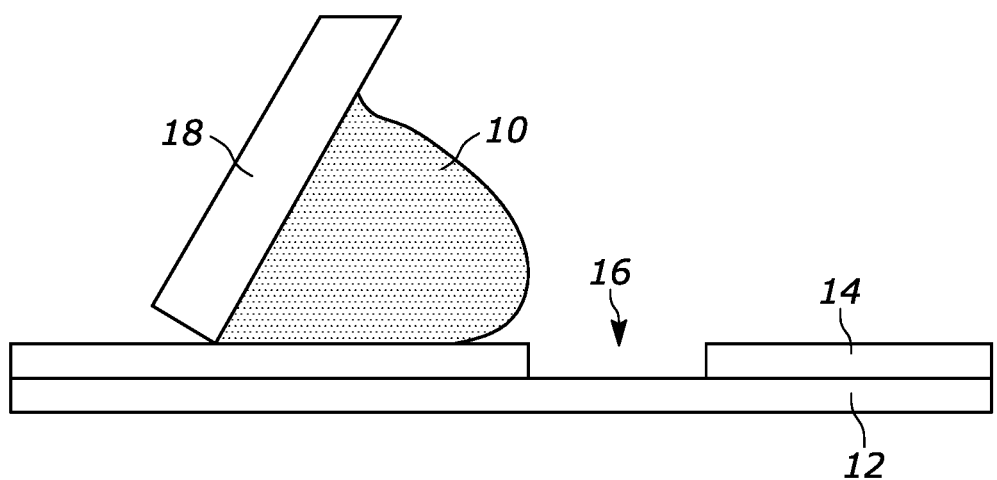
FIG. 1B shows a side view of the same.
Figure 2A:
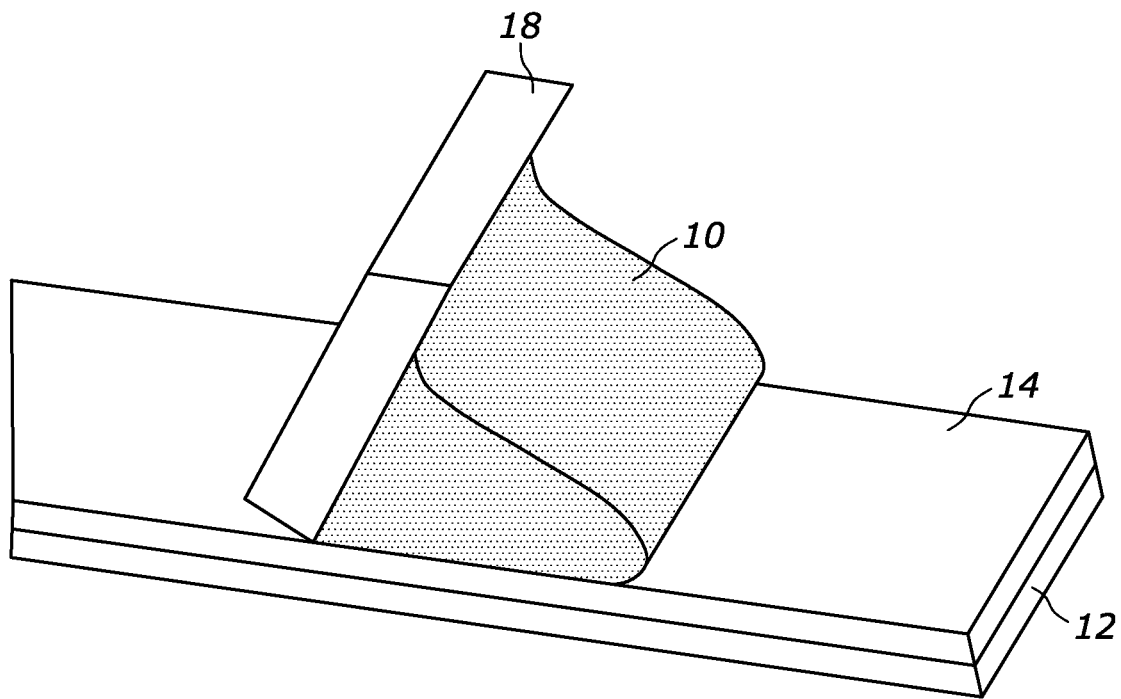
FIG. 2A shows an embodiment of a top perspective view of a squeegee advancing such that the paste is spread into the opening in the stencil and onto the base substrate.
Figure 2B:
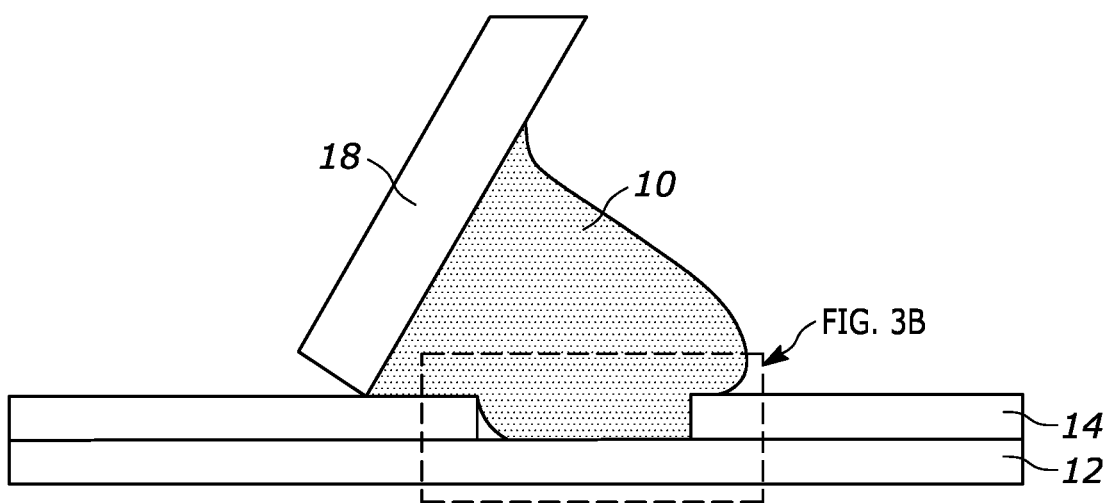
FIG. 2B shows a side view of the same.
Figure 3A:
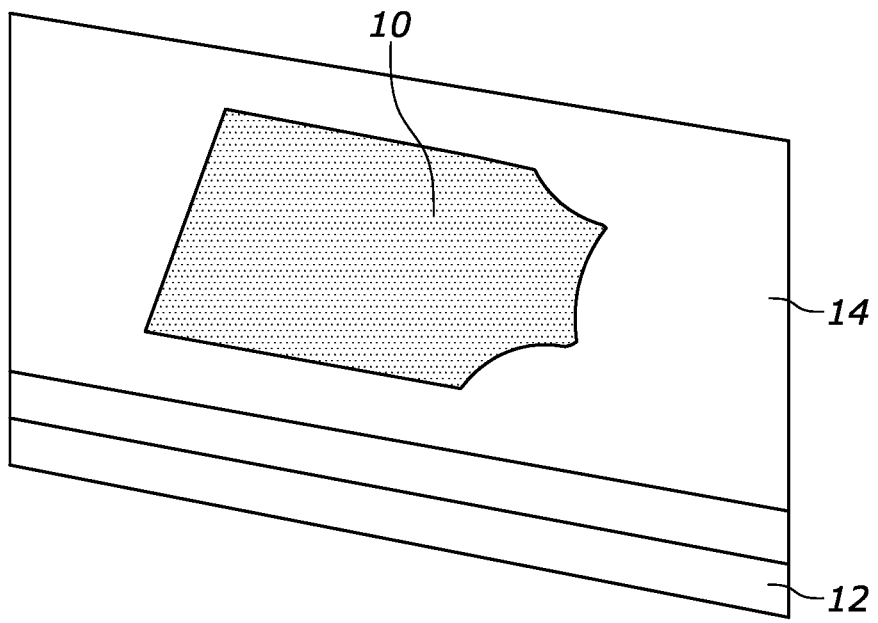
FIG. 3A shows an embodiment of a top perspective view of the squeegee advancing further and no longer above the opening in the stencil.
Figure 3B:
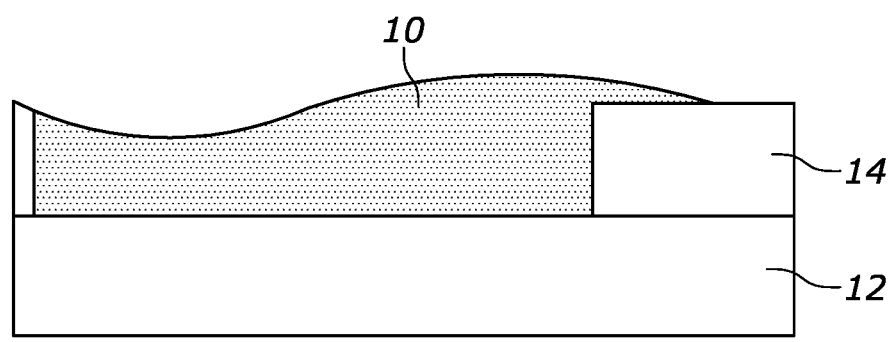
FIG. 3B shows a side view of the same.
Figure 4:
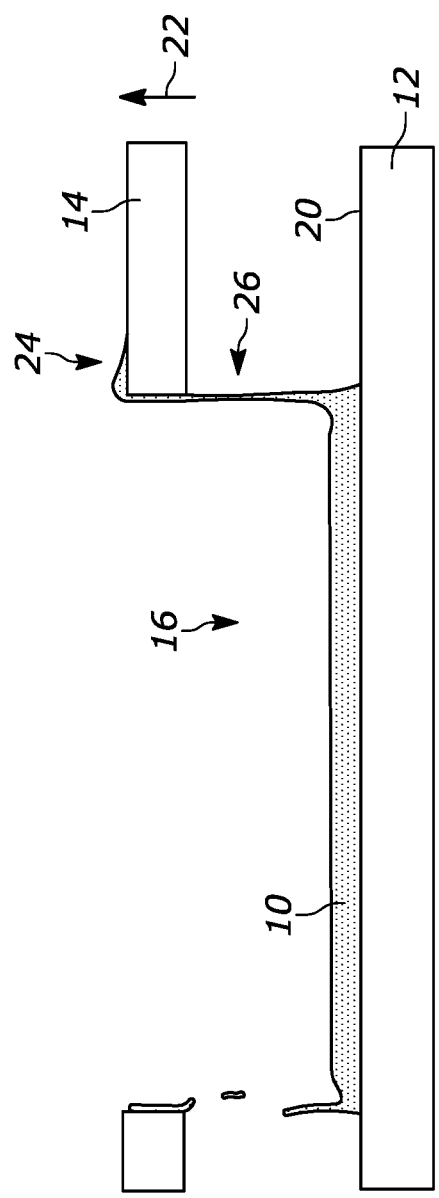
FIG. 4 shows a side view of the stencil being removed from the base substrate in a vertical direction with some of the paste being dragged along, according to an embodiment.

FIGS. 1A and 1B show the squeegee 18 moving across the stencil 14 in a direction toward the opening 16. FIGS. 2A and 2B show the squeegee 18 moved to a position such that the paste 10 has started to fill the opening 16. The squeegee 18 then continues to move across the upper surface of the stencil 14, scraping and leveling the paste 10 so that it is intended to be level and take the shape of the opening 16. FIGS. 3A and 3B show the final shape and outlay of the paste 10 within the stencil 14 with the squeegee removed from the stencil 14.

Figure 5:
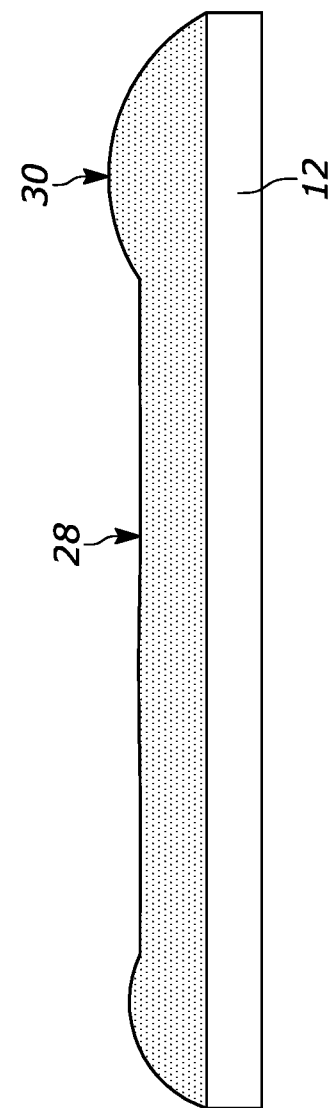
FIG. 5 shows a final shape of the paste on the base substrate with the stencil removed, according to an embodiment.

With the opening 16 of the stencil 14 filled with the conductive paste 10, the stencil 14 can be removed. The stencil 14 can be removed in a vertical direction away from an upper surface 20 of the base 12, as indicated by arrow 22. This removes the stencil 14 from the base 12, leaving behind the 10 on the upper surface 20 of the base 12. The smearing move the squeegee 18 (not shown in FIG. 4) causes some of the paste 10 to be left on an upper surface of the stencil 14, as indicated at 24. Also, due to and during the removal of the stencil 14 from the base 12, a residual amount of the paste 10 is lifted upward and dragged along with the stencil 14, as indicated at 26, and eventually falls back to the base 12 due to gravity and/or surface tension. The final shape of the paste 10 is shown in FIG. 5. This illustrates the shape of the paste 10 once the stencil 14 has been fully removed and the residual paste has fallen back down to the base 12.

Due to the smearing action of the squeegee 18 and the removal action of the stencil 14, the paste 10 assumes a shape having flat region or plateau region 28, as well as a bump at the end of the paste 10. This bump 30 can be referred to as an end-of-track bump 30. The end-of-track bump 30 can cause an undesirable non-contact zone between the pasted track and other parts that are later added to the base 12. Therefore, according to various embodiments disclosed herein, a system and method for reducing the size of this end-of-track bump 30 is provided. In some embodiments, the end of the squeegee that contacts the paste is specifically shaped to reduce the size of the end-of-track bump. In some embodiments, the stencil is lifted at specific speeds to reduce the size of the end-of-track bump. In some embodiments, the stencil is specifically shaped to reduce the size of the end-of-track bump. And in some embodiments, these concepts are combined to further reduce the size of the end-of-track bump. The designs and methods disclosed herein are to improve the surface flatness of the paste by removing or reducing the size of the end-of-track bump 30 such as the one shown in FIG. 5.

FIGS. 6-9 described below illustrate a "base case," which is compared to the later-described improvements to the squeegee design, the stencil removal speed, and the stencil design. In the base case, FIGS. 6-9 show a typical stencil printing process and the generation of an end-of-track bump in the deposited paste. As described in the embodiments illustrated in FIGS. 1-5, the paste 10 is printed onto a base 12 by use of a stencil 14 with an opening 16 therethrough. A squeegee 18 applies the paste 10 to the base via the opening 16. FIG. 6A shows the squeegee 18 moving horizontally to scrape excess paste from the stencil 14. This step can be performed as a subsequent step after the paste 10 is already applied (as shown in FIG. 6A), or as a single step when the paste is applied (as shown in FIGS. 1-3).

In the base case, the squeegee 18 is rectangular shaped, having generally perpendicular corners, the squeegee 18 moves horizontally across the stencil 14 at a speed of 40 millimeters (mm) per second (s), the opening 16 is 4 mm wide, and the stencil thickness (in the vertical direction in FIG. 6A) is 0.1 mm. This is merely an example, and is used as the control to compare to the other designs and embodiments described herein.

Referring to FIGS. 6A-6B, as the squeegee 18 pushes the paste 10 forward (e.g., to the right in the Figures), some of the paste at 32 "attaches" to a bottom surface 34 of the squeegee 18. This is due to the surface tension force of the fluidic paste material forcing some of the paste to follow along with the bottom surface 34, causing the visible ridge in the paste at 32.

Referring to FIGS. 7A-7B, the squeegee 18 is shown completely moved out of the opening 16 of the stencil 14. However, there is still some residual paste at 36 located on an upper surface 38 of the stencil 14. There is also some residual paste at 40 that is beginning to form the end-of-track bump discussed above. The paste left at 36 and 40 is at least partially due to the surface tension force of the fluidic paste material dragging along with the squeegee 18 as described above, and then being left behind as the squeegee 18 is moved beyond the opening 16.

Figure 8A:
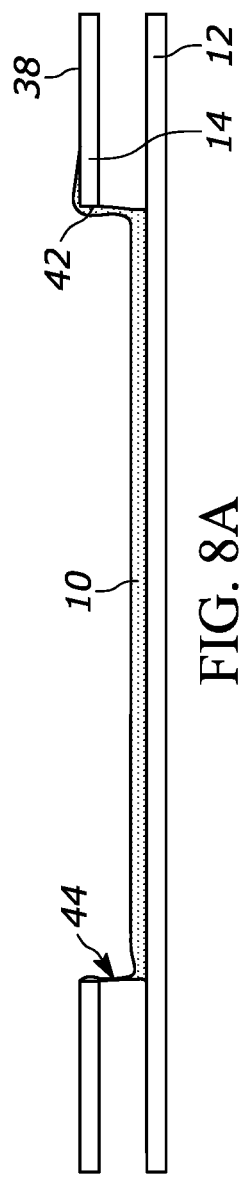
FIG. 8A shows a side view of the stencil of FIG. 7A being removed in a vertical direction.
Figure 8B:
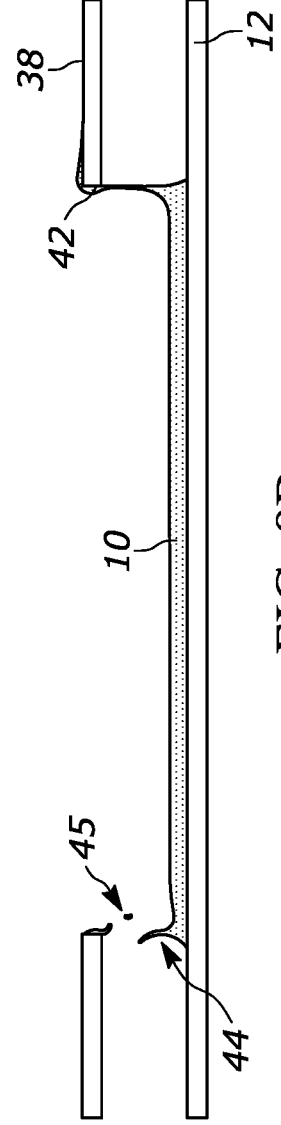
FIG. 8B shows the stencil being removed further still, according to an embodiment.
Figure 9:
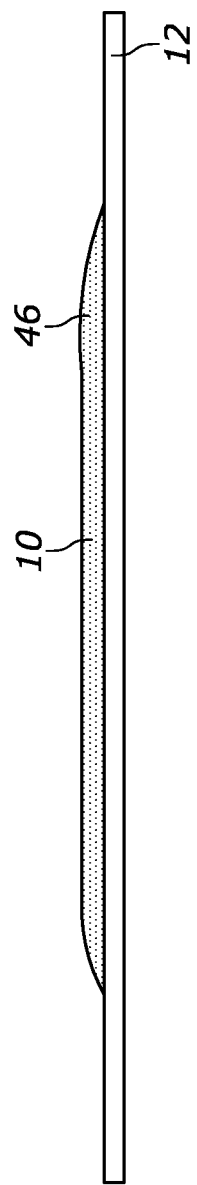
FIG. 9 shows the final shape of the paste after the stencil is removed, highlighting an end-of-track bump, according to an embodiment.

FIG. 8A shows an initial separation of the stencil 14 from the underlying base 12, and FIG. 8B shows a subsequent further separation of the stencil 14 from the underlying base 12. It can be seen that there remains some paste "attached" or held in close contact with the upper surface 38 of the stencil 14 and a side surface 42 of the stencil 14. As the stencil 14 is removed further from the base 12, some of the paste that remains held close to the surfaces 38, 42 drips and falls back to the paste 10 on the base 12. And, as shown at 44, due to the viscosity or thickness of the paste 10, after the stencil 14 moves far enough from the base 12, some of the residual paste 10 on the base 12 may be lifted in a vertical direction away from the base 12 and subsequently snap back to the base 12 once the paste breaks away and is completely separated from the stencil 14. The break in the paste is shown at 45, although this break can happen on either or both sides of the stencil 14. All of this culminates in ultimately forming the end-of-track bump 46 in the final shape of the paste 10 on the base 12 (as shown in FIG. 9) once the stencil 14 is completely removed from the base 12. The morphology of the deposited track of paste 10 does not have optimum flatness due to this end-of-track bump 46.

In all, the end-of-track bump 46 is formed from the following: (1) the surface tension of the paste material causing attachment or hugging of the paste to the edges of the squeegee, which is then dragged onto and deposited onto the stencil; (2) the stencil plate removal process applies a vertical shear force to the deposited track, and the paste that is attached to the stencil falls back to the pasted track on the base; (3) under the effects of surface tension and viscosity, the pasted track—now with the excess paste—gradually forms the end-of-track bump 46.

The embodiment described with reference to FIGS. 6-9 can be referred to as the base case or control case. This base case is compared to other techniques, structures, methods, and results described below with reference to subsequent Figures.

Stencil Removal Speed

Figure 10A:
FIG. 10A shows a comparison of side views of the final shape of the paste in both a base case with the stencil removed at a first speed, and a faster-removal case with the stencil removed at a second speed faster than the first speed, according to an embodiment.
Figure 10B:
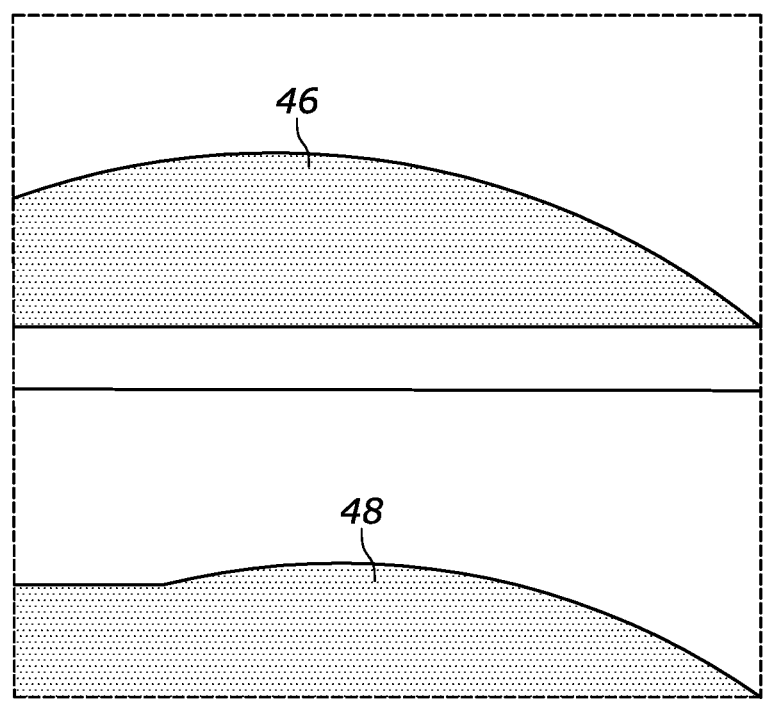
FIG. 10B shows an enlarged region of the comparison of FIG. 10A, showing the differences in the end-of-track bumps.

In one embodiment, the stencil is removed from the underlying base at an increased speed to reduce the size of the end-of-track bump, thereby improving the flatness of the pasted track. Since the stencil removal process applies a vertical shear force to the pasted track, the stencil removal speed can affect the final shape of the deposited track; a faster speed is noticed to increase the shear force. Therefore, the stencil was tested at a vertical removal speed of 1,000 mm/s. FIG. 10A compares the pasted track of base case (e.g., the pasted track of FIG. 9 resulting from a stencil removal speed of 40 mm/s) with the pasted track that results from an increase in stencil removal speed to 1,000 mm/s. FIG. 10B shows an enlarged view of the end-of-track bumps that result from each stencil removal. The stencil removal speed of 1,000 mm/s resulted in a 19% reduction in the height of the end-of-track bump 48 compared to the base case end-of-track bump 46.

This process was repeated for different stencil removal speeds, namely a removal speed of 120 mm/s, 200 mm/s, and 400 mm/s. The removal speed of 120 mm/s was noticed to not have a substantial impact on the overall end-of-track bump height, while the removal speeds of 200 mm/s and 400 mm/s resulted in a similar reduction in height as the removal speed of 1,000 mm/s (e.g., approximately 19% reduction in height). The jump in bump-height reduction from using a 120 mm/s removal speed to a 200 mm/s removal speed may indicate that a sufficiently fast speed can more easily break the residual material attached to the upwardly-moving stencil, thus contributing to a reduction in the amount of paste left in the end-of-track bump. According to an embodiment therefore, a stencil removal speed of greater than 200 mm/s can be utilized to improve the end-of-track bump in the resulting shape of the pasted track. In yet further embodiments, a stencil removal speed of between 200 mm/s and 1,000 mm/s is utilized. In yet further embodiments, a stencil removal speed of approximately 400 mm/s is utilized. The term "approximately" can mean +/−10% or 5% of the value. In yet further embodiments, a stencil removal speed of approximately 200 mm/s is utilized. These removal speeds reduce the end-of-track bump in ways standard removal speeds do not.

Squeegee Design

To reduce the presence and amount of residual paste dragged along with and attached to the squeegee 18 (described above), various embodiments of squeegee designs will now be described. The squeegee designs utilize different shapes at the contacting ends that slide along the stencil 14 to spread and scrape the paste. FIG. 11A shows the squeegee 18 described above with reference to FIGS. 6-7. This squeegee design can be referred to as the base design or control design. The squeegee 18 has a rectangular shape with a leading surface 50 (also referred to as a front surface), a bottom surface 52, and a trailing surface 54 (also referred to as a rear surface or back surface). The leading surface 50 intersects the bottom surface 52 at a generally perpendicular angle. Likewise, the trailing surface 54 intersects the bottom surface 52 at a generally perpendicular angle. The intersection of the leading surface 50 and the bottom surface 52 defines a leading corner or leading edge 56 which defines the lowest point of the squeegee 18 when the squeegee 18 is held at an angle (such as the angle shown in FIGS. 6-7) while scraping across the stencil 14. The leading edge 56 is not only the lowest point of the squeegee 18 when in use, but also the forward-most point of the lower surface 52 when in use in the orientation shown, and every point rearward of the squeegee 18 is located further from the stencil 14. This combination can lead to the phenomena of attachment of paste to the squeegee 18 described above.

FIGS. 11B-11D illustrate various embodiments of squeegee designs that are specifically shaped to address the issue of the residual paste being dragged along with the squeegee in order to reduce or eliminate the ultimate end-of-line bump.

In the embodiment illustrated in FIG. 11B, the squeegee 18' has a leading surface 60, a bottom surface 62, and a trailing surface 64. The bottom surface 62 is angled oblique relative to the leading surface 60 and trailing surface 64. The angles between the bottom surface 62 and the leading and trailing surfaces 60, 64 are such that the bottom surface 62 can be parallel to the upper surface of the stencil as the squeegee 18' is smearing and scraping the paste. In one embodiment, the angle between the bottom surface 62 and the leading surface 60 is between 110 degrees and 140 degrees, and in an embodiment the angle is between 120 degrees and 130 degrees. Conversely, in an embodiment, the angle between the bottom surface 62 and the trailing surface 64 is between 40 and 70 degrees, and in an embodiment the angle is between 50 and 60 degrees. The embodiment of the squeegee 18' illustrated in FIG. 11B can be referred to as the "flat" design because the bottom surface 62 can be engaging the stencil in a flat, parallel, face-to-face relationship as the squeegee 18' is moved across the stencil. This operation is shown in FIG. 12.

In the embodiment illustrated in FIG. 11C, the squeegee 18'' has a leading surface 70, a bottom surface 72, and a trailing surface 74. The bottom surface 72 is angled oblique relative to the leading surface 70 and the trailing surface 74. The angles between the bottom surface 72 and the leading and trailing surfaces 70, 74 are such that the intersection of the bottom surface 72 and the trailing surface 74 (e.g., corner or edge 76) is the point of contact with the paste and stencil as the squeegee 18'' moves along the stencil. This operation is shown in FIG. 13. The embodiment of the squeegee 18'' illustrated in FIG. 11C can be referred to as the "front cut" design because the front of the squeegee 18'' (i.e., the leading edge) is "cut" such that it is the rear part of the squeegee 18'' that pushes the paste. In one embodiment, the angle between the bottom surface 72 and the leading surface 70 is between 135 degrees and 165 degrees, and in an embodiment the angle is between 145 degrees and 155 degrees. Conversely, in an embodiment, the angle between the bottom surface 72 and the trailing surface 74 is between 15 and 45 degrees, and in an embodiment is between 25 and 35 degrees.

In the embodiment illustrated in FIG. 11D, the squeegee 18''' has a leading surface 80 a bottom surface 82, and a trailing surface 84. The bottom surface 82 is rounded. The bottom surface 82 may be semi-circular in shape. The rounded shape of the bottom surface 82 assures that there is always a single point of contact between the bottom surface 82 and the underlying stencil during scraping of the squeegee 18''' no matter the angle of orientation of the squeegee 18'''.

Figure 12A:
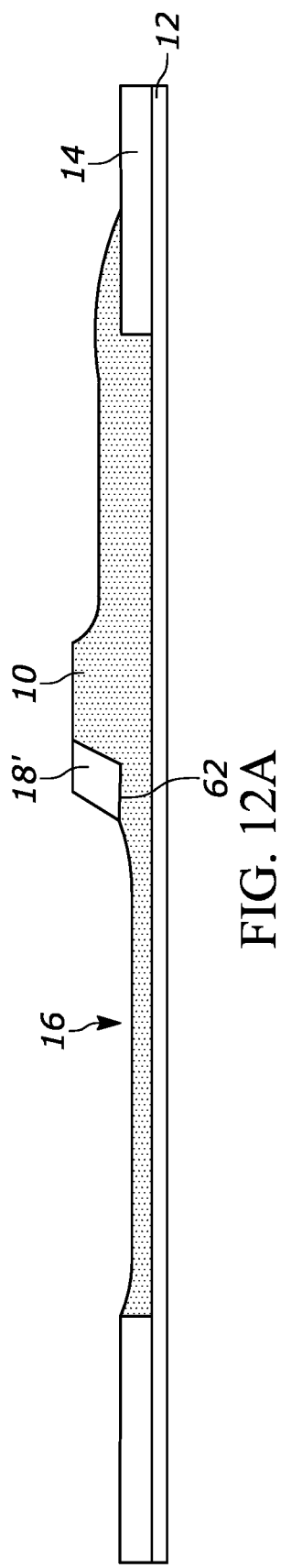
FIG. 12A shows the squeegee of FIG. 11B spreading paste material over a stencil according to an embodiment.
Figure 12B:
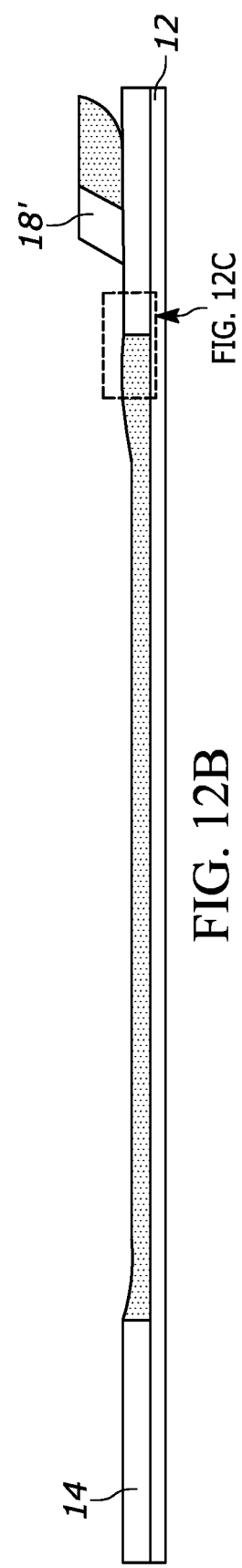
FIG. 12B shows the squeegee further advanced along the stencil.
Figure 12C:
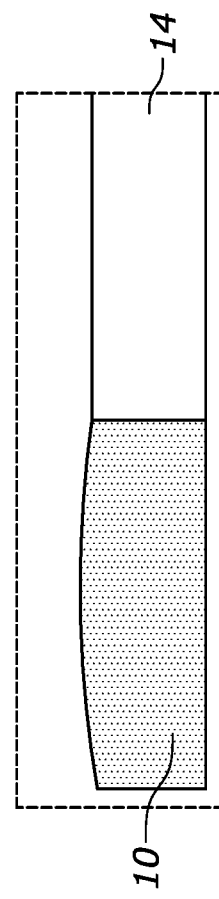
FIG. 12C shows an enlarged region of FIG. 12B showing no residual paste left on the stencil, according to an embodiment.

FIGS. 12-14 show the squeegees of FIGS. 11B-11D, respectively, in operation. Referring to FIG. 12A, the flat design squeegee 18' of FIG. 11B is shown. The squeegee 18' is shown scraping across the stencil (e.g., to the right in the view shown), smearing the paste 10 and scraping the paste. FIG. 12B shows a progression of the squeegee 18', and FIG. 12C shows an enlarged region of where the opening 16 ends. Clearly, due to the flat design as compared to the base design, less paste builds up on the trailing side of the squeegee. This can be due to the bottom surface 62 being flat compared to the underlying paste and the upper surface of the stencil 14. Further, since the bottom surface 62 is flat and smooth relative to upper surface 38 of the stencil 14, the bottom surface 62 can wipe paste off cleanly with the upper surface 38 due to the face-to-face relationship. Less paste is found at the end of the opening 16 as compared to the base case, which ultimately leads to less of an end-of-track bump.

Little or zero paste is left on the upper surface of the stencil 14, which results in less paste flowing back down to the base when the stencil 14 is removed.

FIGS. 13A-C show similar images using the front cut design squeegee 18''. As can be seen in these images as well, the amount of residual paste left at the end of the opening 16 is reduced compared to the base case.

FIGS. 14A-C show similar images using the round design squeegee 18'''. The round design squeegee 18''' has a slight amount of residual paste 10 being dragged along or adhered to the trailing surface and round bottom surface. This leads to a slight amount of paste being deposited onto the upper surface 38 of the stencil 14 after the squeegee 18''' has finished scraping across the stencil 14.

Figure 15:
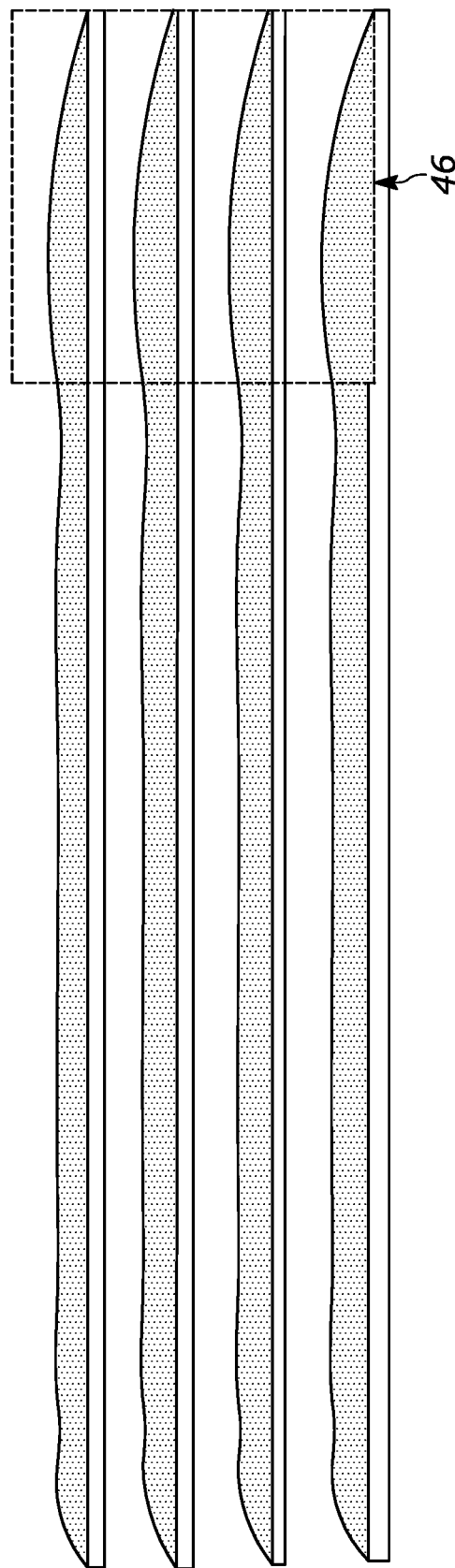
FIG. 15 shows a comparison of the final shape of the paste after the squeegees of FIGS. 11A-11D are used and the stencils are removed, according to embodiments.

FIG. 15 shows a comparison of the final shape of the paste 10 after utilizing each of the squeegee 18, 18', 18'', and 18'''. It is noted that both the flat design squeegee 18' and the round design squeegee 18''' each reduced the final height of the end-of-track bump 46 by roughly 5% compared to the base squeegee 18. The front cut design squeegee 18'' increased the height of the end-of-track bump 46 by roughly 6% compared to the base squeegee 18.

In each of the embodiments of the squeegee designs described above, the squeegee may have a thickness of less than 1 mm. In other embodiments, the thickness of the squeegee is greater than 1 mm. The thickness refers to the distance between the leading surface and the trailing surface. In particular embodiments, the squeegee has a thickness of between 0.1 mm and 0.5 mm. The squeegee may rubber, plastic, or other synthetic material, or may be metal. The squeegee may embody a blade.

Stencil Design

Since the end-of-track bump described above is at least partially caused by the vertical shear force introduced by removal of the stencil 14, the shear force may be reduced if the paste material is away from the vertical side surface 42 of the stencil 14. Therefore according to embodiments, the design of the stencil 14 is altered to allow the removal of more paste from the side surface 42 such that less paste stays in contact with the side surface 42 during vertical removal of the stencil 14, and thus less paste is pulled back or fallen down to the base 12 as the stencil 14 is removed.

FIGS. 16A and 16B show a stencil 90 according to one embodiment. The stencil 90 has a stepped edge feature to allow a gradual or broken transition from the paste 10 to the stencil 90 as the squeegee 18' is slid across the stencil. The stencil 90 has a first sidewall 92, a floor 94, a second sidewall 96, and an upper surface 98. The sidewalls 92, 96 are shown to intersect the floor 94 at right angles, although in other embodiments other angle are utilized. The floor 94 connects the first sidewall 92 from the second sidewall 96. The floor 94 provides a landing zone for some residual paste 10 to be delivered to as the squeegee 18' is scraped across the upper surface 98 of the stencil 90.

In the embodiment of FIGS. 16A-16B, the thickness of the entire stencil 90 from the bottom surface to the upper surface 98 is 0.1 mm. Of course, the teachings of this disclosure can be applied to stencils having a thickness of greater than 0.1 mm, and the dimensions explained herein are merely exemplary. The length of the floor 94 from the first sidewall 92 to the second sidewall 96 is 1 mm. The height of the second sidewall is 0.05 mm; thus it can be said that the height or depth of the step feature of the stencil 90 is 0.05 mm. The first sidewall 92 is spaced from a sidewall 99 of the stencil 90 that defines the beginning of the opening 16 by 4 mm. The length of the entire opening 16 is 5 mm, from the sidewall 99 to the second sidewall 96.

FIGS. 17A and 17B show a stencil 100 with a stepped edge of another embodiment.

In this embodiment, the stencil 100 has a first sidewall 102, a floor 104, a second sidewall 106, and an upper surface 108, each of which is similar to the embodiment of FIGS. 16A-16B except different in size. For example, in this embodiment, the length of the floor 104 from the first sidewall 102 to the second sidewall 106 is 1 mm, the height of the first sidewall 102 is 0.01 mm, and the height of the second sidewall 106 is 0.09 mm, combining to define an overall thickness of the stencil 100 of 0.1 mm once again. It can thus be said that the height or depth of the step feature of the stencil 100 is 0.09 mm. The second sidewall 106 in this embodiment is taller than the second sidewall 96 of the previous embodiment. This allows more paste 10 to gather and be collected above the floor 104 while the squeegee 18" is scraped across the upper surface 108 of the stencil 100.

Figure 18A:
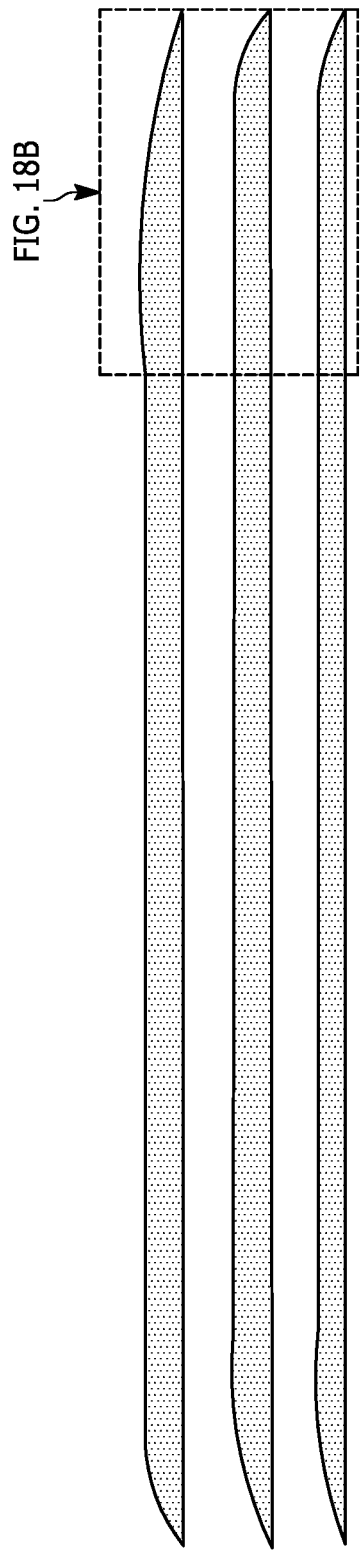
FIG. 18A shows a comparison of the final shape of the paste after using a stencil having no stepped edge, another stencil having a stepped edge according to the embodiment in FIG. 16A, and another stencil having a stepped edge according to the embodiment in FIG. 17A.
Figure 18B:
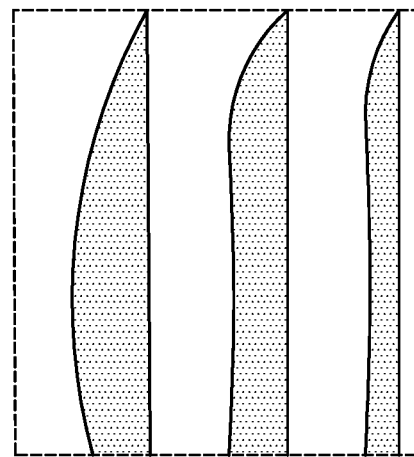
FIG. 18B shows an enlarged view of the end-of-track bumps of the comparison.

Once the squeegee 18" is done spreading and scraping the paste 10 into the opening and across the upper surface of the stencils, the stencils with their stepped edges can be vertically removed from the respective underlying bases. FIG. 18A illustrates a comparison of the final shape of the paste on its underlying base once the stencils are removed. The upper paste is the base case, using no stepped edge. The middle paste is after using the stencil 90 of FIG. 16, and the lower paste is after using the stencil 100 of FIG. 17. FIG. 18B shows an enlarged region of FIG. 18A, highlighting the end-of-track bumps left on each track of paste. The end-of-track bump left on the paste is significantly smaller in each embodiment having a stepped edge compared to the base case with no stepped edge. And, the embodiment of the stencil of FIG. 17 results in a smaller end-of-track bump than the embodiment of the stencil of FIG. 16.

FIGS. 19A-19D show four additional embodiments of stencils with stepped edges to assist in reducing or eliminating the end-of-track bump. In each of these embodiments, a constant step height of 0.05 mm is used, and a constant thickness of the stencil 101 In other words, in each embodiment the stepped edge includes a first sidewall 110, a floor 112, and a second sidewall 114, and in each embodiment the height of the second sidewall 114 is the same. The difference in these embodiments is the length of the floor 112. In the embodiment of FIG. 19A, the length of the floor 112 (i.e., from the first sidewall 110 to the second sidewall 114) is 1 mm. In the embodiment of FIG. 19B, the length of the floor 112 (i.e., from the first sidewall 110 to the second sidewall 114) is 0.7 mm. In the embodiment of FIG. 19C, the length of the floor 112 (i.e., from the first sidewall 110 to the second sidewall 114) is 0.4 mm. And, in the embodiment of FIG. 19D, the length of the floor 112 (i.e., from the first sidewall 110 to the second sidewall 114) is 0.1 mm.

It has been realized through tests that the length of the floor 112 can alter the end-of-track bump that eventually forms on the paste. The embodiments of FIGS. 19A-19B can reduce the size of the end-of-track bump by around 40%. The embodiment of FIG. 19C can reduce the size of the end-of-track bump by about 48%. And, the embodiment of FIG. 19D can reduce the size of the end-of-track bump by about 31%. Therefore, even a small stepped edge with a 0.1 mm floor length can have significant benefits to the size of the later-formed end-of-track bump when the stencil is removed.

It should be understood that the embodiments described herein can be combined to form other embodiments. For example, each of the modified squeegee designs can be combined with a respective one of the stepped edge stencil design to result in even more size reduction in the end-of-track bump.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A method of manufacturing a conductive track on a board via stencil printing, the method comprising:
    placing a stencil over an underlying base, wherein the stencil has an opening extending therethrough;
    applying a conductive paste within the opening such that a first portion of the conductive paste contacts the underlying base;
    scraping a second portion of the conductive paste off of the stencil using a squeegee with the first portion of the conductive paste remaining in the opening; and
    removing the entire stencil from the underlying base in a vertical direction at a speed of at least 200 millimeters per second, leaving behind the first portion of the conductive paste.

2. The method of claim 1, wherein the step of removing includes removing the stencil from the underlying base at a speed of between 200 and 1000 millimeters per second.

3. The method of claim 1, wherein the step of removing includes removing the stencil from the underlying base at a speed of approximately 400 millimeters per second.

4. The method of claim 1, wherein the step of removing includes removing the stencil from the underlying base at a speed of at least 400 millimeters per second.

5. The method of claim 1, wherein the step of applying includes applying a third portion of the conductive paste onto a ledge within the opening and beneath an upper surface of the stencil.

6. The method of claim 5, wherein the step of removing includes carrying at least some of the third portion of the conductive paste with the stencil on the ledge as the stencil is removed from the underlying base.

7. The method of claim 1, wherein the scraping includes using the squeegee having a leading surface, a trailing surface, and a bottom surface, wherein the bottom surface is angled oblique relative to the leading surface and the trailing surface.

8. The method of claim 7, wherein the scraping includes scraping a bottom-most edge of the squeegee against an upper surface of the stencil, wherein the bottom-most edge of the squeegee is located at an intersection of the bottom surface of the squeegee and the trailing surface of the squeegee.

9. The method of claim 8, wherein the scraping includes carrying some of the second portion of the conductive paste across the upper surface of the stencil forward of the bottom-most edge of the squeegee and beneath the bottom surface of the squeegee.

* * * * *